(12) United States Patent
Bergendahl et al.

(10) Patent No.: US 10,249,762 B2
(45) Date of Patent: *Apr. 2, 2019

(54) VERTICALLY ALIGNED NANOWIRE CHANNELS WITH SOURCE/DRAIN INTERCONNECTS FOR NANOSHEET TRANSISTORS

(71) Applicant: International Business Machines Corporation, Armonk, NY (US)

(72) Inventors: Marc A. Bergendahl, Troy, NY (US); Kangguo Cheng, Schenectady, NY (US); Eric R. Miller, Schenectady, NY (US); John R. Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/938,367

(22) Filed: Mar. 28, 2018

(65) Prior Publication Data

US 2018/0219101 A1    Aug. 2, 2018

Related U.S. Application Data

(60) Continuation of application No. 15/591,239, filed on May 10, 2017, which is a division of application No.
(Continued)

(51) Int. Cl.
*H01L 29/66* (2006.01)
*H01L 29/786* (2006.01)
(Continued)

(52) U.S. Cl.
CPC ........ *H01L 29/78618* (2013.01); *B82Y 10/00* (2013.01); *H01L 21/76805* (2013.01);
(Continued)

(58) Field of Classification Search
CPC ........ H01L 29/78618; H01L 29/78696; H01L 29/775; H01L 29/785; H01L 29/0653;
(Continued)

(56) References Cited

U.S. PATENT DOCUMENTS 8,422,273 B2   4/2013  Chang et al.
8,679,902 B1   3/2014  Basker et al.
(Continued)

FOREIGN PATENT DOCUMENTS

WO    2015190852    12/2015

OTHER PUBLICATIONS

U.S. Appl. No. 15/008,615, filed Jan. 28, 2016.
(Continued)

*Primary Examiner* — Dao H Nguyen
(74) *Attorney, Agent, or Firm* — Fleit Gibbons Gutman Bongini Bianco PL; Thomas S. Grzesik

(57) ABSTRACT

A nano-sheet semiconductor structure and a method for fabricating the same. The nano-sheet structure includes a substrate and at least one alternating stack of semiconductor material layers and metal gate material layers. The nano-sheet semiconductor structure further comprises a source region and a drain region. A first plurality of epitaxially grown interconnects contacts the source region and the semiconductor layers in the alternating stack. A second plurality of epitaxially grown interconnects contacts the drain region and the semiconductor layers in the alternating stack. The method includes removing a portion of alternating semiconductor layers and metal gate material layers. A first plurality of interconnects is epitaxially grown between and in contact with the semiconductor layers and the source region. A second plurality of interconnects is epitaxially grown between and in contact with the semiconductor layers and the drain region.

20 Claims, 15 Drawing Sheets

Related U.S. Application Data

15/248,237, filed on Aug. 26, 2016, now Pat. No. 9,905,643.

(51) Int. Cl.
| | |
|---|---|
| *H01L 21/768* | (2006.01) |
| *H01L 29/06* | (2006.01) |
| *H01L 29/08* | (2006.01) |
| *H01L 27/088* | (2006.01) |
| *H01L 21/8234* | (2006.01) |
| *H01L 29/423* | (2006.01) |
| *B82Y 10/00* | (2011.01) |
| *H01L 29/40* | (2006.01) |
| *H01L 29/417* | (2006.01) |
| *H01L 29/775* | (2006.01) |
| *H01L 29/78* | (2006.01) |

(52) U.S. Cl.
CPC ............ *H01L 21/76895* (2013.01); *H01L 21/823437* (2013.01); *H01L 21/823468* (2013.01); *H01L 21/823475* (2013.01); *H01L 21/823481* (2013.01); *H01L 27/088* (2013.01); *H01L 29/0649* (2013.01); *H01L 29/0653* (2013.01); *H01L 29/0673* (2013.01); *H01L 29/0847* (2013.01); *H01L 29/401* (2013.01); *H01L 29/41725* (2013.01); *H01L 29/42392* (2013.01); *H01L 29/66439* (2013.01); *H01L 29/66545* (2013.01); *H01L 29/66742* (2013.01); *H01L 29/775* (2013.01); *H01L 29/785* (2013.01); *H01L 29/78696* (2013.01); *H05K 999/99* (2013.01)

(58) Field of Classification Search
CPC .............. H01L 29/0673; H01L 29/401; H01L 29/41725; H01L 29/42392; H01L 29/66439; H01L 29/66742; H01L 29/66545; H01L 21/76805; H01L 21/76895; H01L 21/823475; H01L 21/823437; H01L 21/823468; H01L 27/088; B82Y 10/00

USPC ........ 257/213, 344, 347, 365, 401, E29.004, 257/E29.022, E29.117, E29.128, E29.137, 257/E29.286, E29.296, E21.409, E21.415, 257/E21.421, E21.431; 438/157, 282, 438/284, 300, 305, 686

See application file for complete search history.

(56) References Cited

U.S. PATENT DOCUMENTS

| | | |
|---|---|---|
| 9,123,567 B2 | 9/2015 | Radosavljevic et al. |
| 9,129,829 B2 | 9/2015 | Kuhn et al. |
| 9,287,357 B2 | 3/2016 | Rodder et al. |
| 9,318,553 B1 | 4/2016 | Cheng et al. |
| 9,431,512 B2 * | 8/2016 | Koh ................ B82Y 10/00 |
| 9,620,590 B1 | 4/2017 | Bergendahl et al. |
| 9,941,405 B2 * | 4/2018 | Kittl .................. H01L 29/7848 |
| 2010/0295022 A1 | 11/2010 | Chang et al. |
| 2014/0151639 A1* | 6/2014 | Chang ............... H01L 29/42392 257/27 |
| 2015/0069328 A1 | 3/2015 | Leobandung |
| 2015/0236120 A1 | 8/2015 | Hashemi et al. |
| 2015/0295084 A1 | 10/2015 | Obradovic et al. |
| 2015/0364542 A1 | 12/2015 | Rodder et al. |
| 2016/0020305 A1* | 1/2016 | Obradovic .......... H01L 29/7391 257/39 |
| 2016/0163796 A1 | 6/2016 | Obradovic et al. |
| 2017/0110554 A1 | 4/2017 | Tak et al. |
| 2017/0141207 A1 | 5/2017 | Cheng et al. |
| 2018/0061992 A1* | 3/2018 | Bergendahl ....... H01L 29/78618 |

OTHER PUBLICATIONS

Tachi, K., et al., "3D Source/Drain Doping Optimization in Multi-Channel MOSFET", Proceedings of the European Solid State Device Research Conference, Sep. 14-16, 2010, pp. 1-4.
List of IBM Patents or Patent Applications Treated As Related.

\* cited by examiner ional view of the nano-sheet semi-
VERTICALLY ALIGNED NANOWIRE CHANNELS WITH SOURCE/DRAIN INTERCONNECTS FOR NANOSHEET TRANSISTORS

BACKGROUND OF THE INVENTION

The present invention generally relates to the field of semiconductors, and more particularly relates to nanowire field-effect-transistors.

Nanowire field-effect-transistor (FET) devices include a nanowire arranged on a substrate. A gate stack is arranged conformally on a channel region of the nanowire. Source and drain regions of the nanowire extend outwardly from the channel region.

As the size of semiconductor devices decreases, it has become desirable to increase the density of the arrangement of FET devices on a substrate.

SUMMARY OF THE INVENTION

In one embodiment, a method for fabricating a semiconductor structure is provided. The method includes forming a structure including at least an alternating stack of semiconductor layers with variable spacing/thicknesses and metallic gates formed on a substrate. The metal gate is formed on and in contact with a top layer of the alternating stack, a source region and a drain region in contact with the semiconductor layers of the alternating stack, and dielectric layers formed on and in contact with a top surface of the source and drain regions, respectively. The method includes depositing a dielectric spacer to protect areas the semiconductor layers and metal gate while removing regions left exposed. The removal process forms a trench exposing sidewalls of the metal gate and sidewalls of the source and drain regions. A first plurality of interconnects is epitaxially grown between and in contact with the semiconductor layers and the source region. A second plurality of interconnects is epitaxially grown between and in contact with the semiconductor layers and the drain region.

In another embodiment, a semiconductor structure is provided. The semiconductor structure includes a substrate and at least one alternating stack of semiconductor material layers and metal gate material layers disposed on the substrate. A metal gate is disposed on and in contact with the alternating stack of semiconductor material layers and metal gate material layers. The semiconductor structure further comprises a source region and a drain region. A first plurality of epitaxially grown interconnects contacts the source region and the semiconductor layers in the alternating stack. A second plurality of epitaxially grown interconnects contacts the drain region and the semiconductor layers in the alternating stack.

In yet another embodiment, an integrated circuit is provided. The integrated circuit includes a semiconductor structure. The semiconductor structure includes a substrate and at least one alternating stack of semiconductor material layers and metal gate material layers disposed on the substrate. A metal gate is disposed on and in contact with the alternating stack of semiconductor material layers and metal gate material layers. The semiconductor structure further comprises a source region and a drain region. A first plurality of epitaxially grown interconnects contacts the source region and the semiconductor layers in the alternating stack. A second plurality of epitaxially grown interconnects contacts the drain region and the semiconductor layers in the alternating stack

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
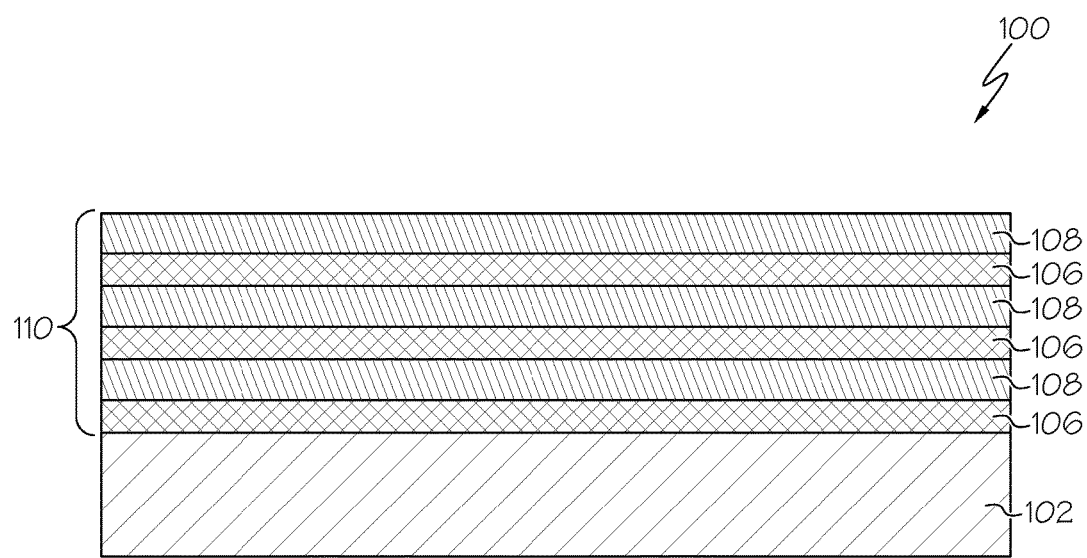
FIG. 1 is a cross-sectional view of an initial nano-sheet semiconductor structure comprising an alternating stack of first and second semiconductor layers according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

One or more embodiments include a design for an integrated circuit chip, which is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer is able to transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein are utilized in the fabrication of integrated circuit chips. The resulting integrated circuit chips are distributable by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-13 illustrate various processes for fabricating nano-sheet FETs having vertically aligned nano-sheet/nanowire channels and source/drain interconnects. FIG. 1 illustrates one example of a semiconductor structure 100 that includes a handle substrate 102, and a stack of alternating first semiconductor material and a second semiconductor material. The handle substrate 102, in one embodiment, includes a semiconductor material, an insulator material, a conductive material, or a combination thereof. The thickness of the handle substrate 102, in one embodiment, ranges from 50 microns to 2 mm, although lesser and greater thicknesses can also be employed.

The stack includes at least one first semiconductor material layer 106 and at least one second semiconductor material layer 108. In one embodiment, the stack can include a plurality of first semiconductor material layers 106 and a plurality of second semiconductor material layers 108. As used herein, a "semiconductor material" refers to a material having a conductivity in a range from $3.0 \times 10^{-4}$ Ohm-cm to $3.0 \times 10^3$ Ohm-cm, and includes an intrinsic semiconductor material, a p-doped semiconductor material, an n-doped semiconductor material, or a combination of semiconductor materials having different types of doping. The first semiconductor material layers 106 include a first semiconductor material that can be removed selective to the second semiconductor material of the second semiconductor material layers 108. Each of the at least one first semiconductor material layers 106 and the second semiconductor material layers 108 can be single crystalline. In one embodiment, the entirety of the stack (106, 108) is single crystalline In one embodiment, the first semiconductor material layers 106 include a silicon-containing semiconductor material in which the atomic concentration of silicon is greater than 80%, and the second semiconductor material layers 108 include a germanium-containing semiconductor material in which the atomic concentration of germanium is greater than 20%. For example, the first semiconductor material layers 106 can include single crystalline silicon or a single crystalline silicon-germanium alloy in which the atomic concentration of germanium is less than 20%.

In another embodiment, the first semiconductor material layers 106 include a first single crystalline compound semiconductor material, and the second semiconductor material layers 108 include a second single crystalline compound semiconductor material that can be removed selective to the first single crystalline compound semiconductor material. For example, the first semiconductor material layers 108 include In—$Ga_{1-x}As$, GaAs, or InP, and the second semiconductor material layers 108 include GaP or GaN. In one embodiment, each of the first semiconductor material layers 106 is deposited as a single crystalline semiconductor material layer in epitaxial alignment with an underlying material layer. In one embodiment, each of the second semiconductor material layers 108 is deposited as a single crystalline material layer in epitaxial alignment with an underlying material layer.

The thicknesses of the first semiconductor material layers 106 and the second semiconductor material layers 108 are selected such that the entirety of the epitaxial alignment of the first semiconductor material layers 106 and the second semiconductor material layers 108 can be maintained throughout the entirety of the stack. Thus, the thickness of each of the first semiconductor material layers 106 and the second semiconductor material layers 108 is less than the corresponding critical thickness, which is the thickness at which an epitaxial material begins to lose epitaxial registry with the underlying single crystalline layer by developing dislocations. For example, the thickness of each of the first semiconductor material layers 106 and the second semiconductor material layers 108 is in a range from 3 nm to 60 nm, although lesser and greater thicknesses can also be employed.

In some embodiments, the stack (106, 108) is formed by a series of epitaxial growth processes. The terms "epitaxial growth", "epitaxial deposition", "epitaxially formed", epitaxially grown", and their variants and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

In one embodiment, the number of repetitions for a pair of a first semiconductor material layer 106 and a second semiconductor material layer 108 is 2 or greater. In one embodiment, the number of repetitions for a pair of a first semiconductor material layer 106 and a second semiconductor material layer 108 is in a range from, and including, 2 to, and including, 100. The stack (106, 108), in one embodiment, begins, at the bottom, with a first semiconductor material layer 106 or with a second semiconductor material layer 108. In one embodiment, the stack terminates, at the top, with a first semiconductor material layer 106 or with a second semiconductor material layer 108.

An optional cap material layer (not shown) can be formed on top of the stack (106, 108). The cap material layer, in one embodiment, includes a dielectric material such as silicon nitride, silica oxide or a dielectric metal oxide, and can be formed by chemical vapor deposition (CVD). The thickness of the cap material layer, in one embodiment, ranges from 3 nm to 60 nm, although lesser and greater thicknesses can also be employed. The stack (106, 108) of the first semiconductor material layers 106 and the second semiconductor material layers 108 are patterned to form the one or more alternating vertical stacks 110 of alternating first and second semiconductor material layers 106, 108, as shown in FIG. 1.

For example, a photoresist layer (not shown) can be applied over the top second semiconductor material layer 108 (or the optional cap layer if formed) and lithographically patterned to cover a contiguous area. The shape of the contiguous area covered by the patterned photoresist layer can be selected to include an elongated region having a same width and two end portions having a greater width than the elongated region. The pattern in the photoresist layer can be transferred through the alternating stack by an anisotropic etch. A remaining portion of the stack of the first semiconductor material layers 106 and the second semiconductor material layers 108 constitute the alternating stack 110 of the first semiconductor material portions 106 and the second semiconductor material portions 108. In one embodiment, the entirety of the alternating stack 110 can be single crystalline. Besides the lithography patterning, other patterning techniques such as sidewall imaging transfer, multiple patterning, or the combination of those techniques can be used to pattern the stack.

In one embodiment, each of the first semiconductor material portions 106 and the second semiconductor material portions 108 has a uniform width in a range from 10 nm to 100 nm. The first semiconductor material portions 106 and the second semiconductor material portions 108, in one embodiment, have sidewalls that are vertically coincident among one another. As used herein, surfaces are "vertically coincident" if the surfaces are located within a same vertical plane. In one embodiment, first semiconductor material portions 106 and the second semiconductor material portions 108 have a same horizontal cross-sectional shape. In one embodiment, first semiconductor material portions 106 and the second semiconductor material portions 108 are semiconductor material fins and second semiconductor material fins, respectively. As used herein, a "fin" refers to a structure having a pair of vertical sidewalks and a uniform width between the pair of vertical sidewalk that is invariant under translation along the direction of the vertical sidewalls. The alternating stack 110 of the first semiconductor material portions 106 and the second semiconductor material portions 108 constitutes a semiconductor fin having a pair of parallel sidewalk that extend along a lengthwise direction and having a uniform width throughout. As used herein, a "lengthwise direction" is a horizontal direction around which an axis passing through a center of mass of an element would have the least moment of inertia.

In one embodiment, the first semiconductor material portions 106 and the second semiconductor material portions 108 are single crystalline and epitaxially aligned among one another. Further, the first semiconductor material portions 106 and the second semiconductor material portions 108, in on embodiment, have different lattice constants. In this case, the first semiconductor material portions 106 and the second semiconductor material portions 108 can be in opposite types of stress along horizontal directions. If the optional cap layer is employed, it can be removed once the alternating stack 110 of the first semiconductor material portions 106 and the second semiconductor material portions 108 is formed, for example, by a wet etch that removes the material of the cap layer selective to the substrate 102 and the alternating stack 110 of the first semiconductor material portions 106 and the second semiconductor material portions 108.

Figure 2A:
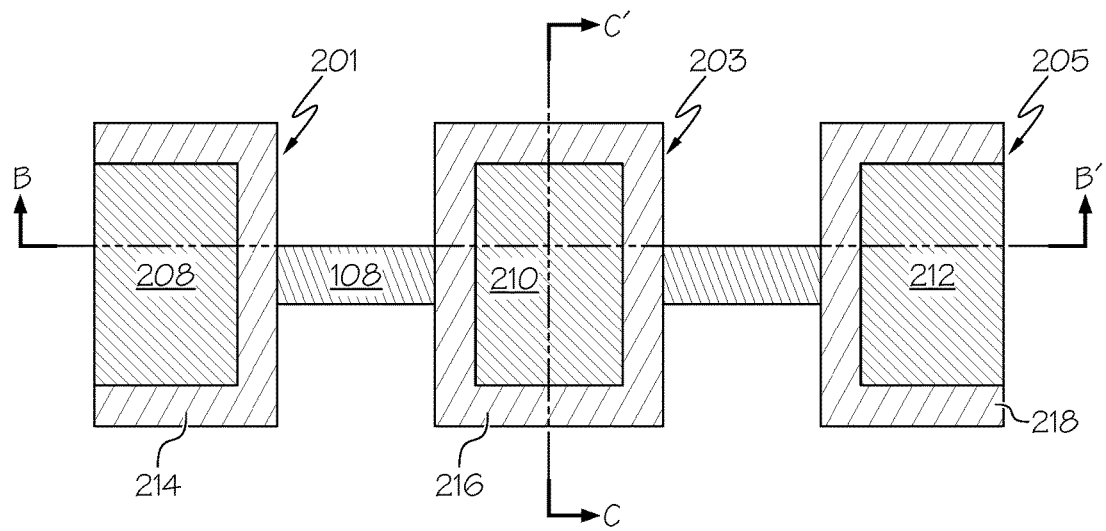
FIG. 2A is a top-down view of the nano-sheet semiconductor structure after disposable gates and their spacers have been formed thereon according to one embodiment of the present invention.
Figure 2B:
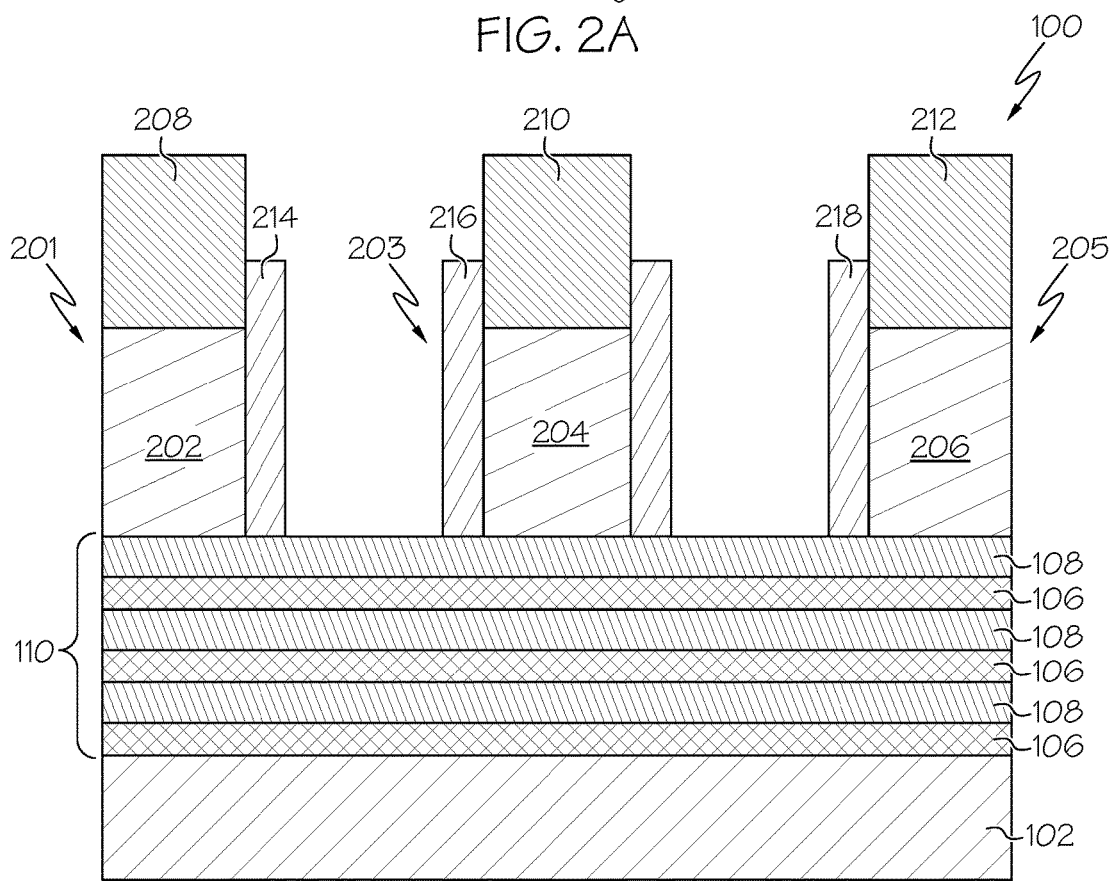
FIG. 2B is a cross-sectional view of the nano-sheet semiconductor structure taken along line B-B' shown in FIG. 2A after disposable gates and their spacers have been formed thereon according to one embodiment of the present invention.
Figure 2C:
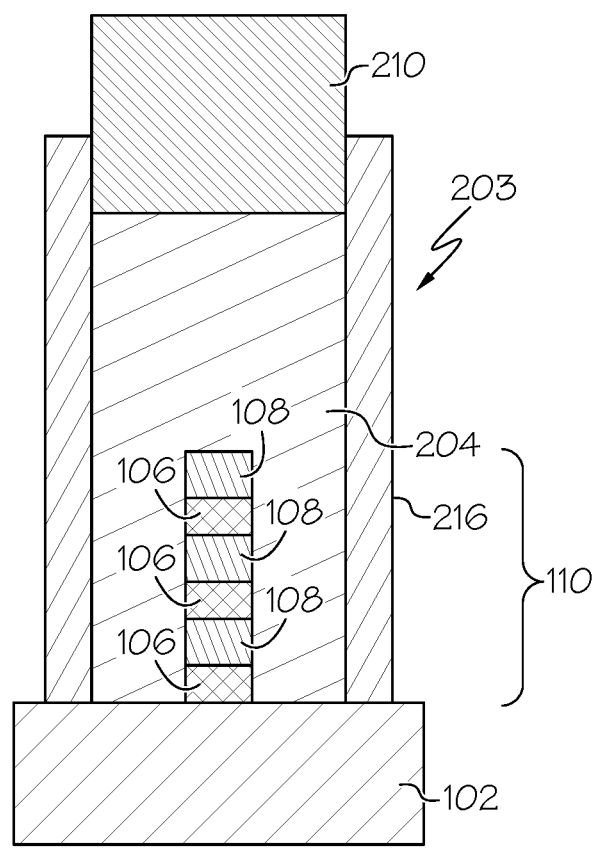
FIG. 2C is a cross-sectional view of the nano-sheet semiconductor structure taken along line C-C' shown in FIG. 2A after disposable gates and their spacers have been formed thereon according to one embodiment of the present invention.

FIGS. 2A-2C show that one or more disposable gate structures 201, 203, 205 are formed over and across (wrapping) the alternating stack 110 of the first semiconductor material portions 106 and the second semiconductor material portions 108. FIG. 2A shows a top-down view of the structure 100, whereas FIGS. 2B and 2C are cross-sections taken along lines B-B' and C-C', respectively, shown in FIG. 2A. In one embodiment, each of the disposable gate structures 201, 203, 205 includes a disposable gate portion 202, 204, 206 and a disposable gate cap 208, 210, 212. In one embodiment, the disposable gate portions 202, 204, 206 include a dielectric material. For example, the disposable gate portions 202, 204, 206 include amorphous carbon, diamond-like carbon (DLC), a dielectric metal oxide, silicon nitride, or an organosilicate glass. Alternatively, the disposable gate portions 202, 204, 206 include a stack of a disposable material liner (not shown) and a disposable gate material portion (not shown). In this case, the disposable material liner can include a dielectric material such as silicon oxide. The disposable gate material portion, in one embodiment, includes a dielectric material, a semiconductor material, or a conductive material, provided that the disposable gate material portion can be removed selective to the dielectric materials of a planarization dielectric layer and a gate spacer to be subsequently formed. The disposable gate caps 208, 210, 212, include a material such as silicon nitride.

The disposable gate structures 201, 203, 205, in one embodiment, are formed by deposition and patterning of at least one material layer. The patterning of the at least one material layer can be performed by a combination of lithographic methods and an anisotropic etch. The disposable gate structures 201, 203, 205 straddle, and contacts sidewalk of, the alternating stack 110 of the first semiconductor material portions 106 and the second semiconductor material portions 108.

FIG. 2 further shows that a gate spacer 214, 216, 218 is formed around (wraps) each of the disposable gate structure 201, 203, 205. In one embodiment, the gate spacers 214, 216, 218, are formed by depositing a conformal dielectric material layer on the disposable gate structures 201, 203, 205 and the alternating stack 110 of the first semiconductor material portions 106 and the second semiconductor material portions 108, and anisotropically etching the conformal dielectric material layer. The conformal dielectric material layer includes a dielectric material that is different from the material of the disposable gate portions 202, 204, 206. For example, the conformal dielectric material layer can include silicon nitride, silicon oxide, and/or dielectric metal oxide. An anisotropic etch process is employed to anisotropically etch horizontal portions of the conformal dielectric material layer. Further, vertical portions of the conformal dielectric material layer are recessed below a top surface of the disposable gate caps 208, 210, 212.

Figure 3:
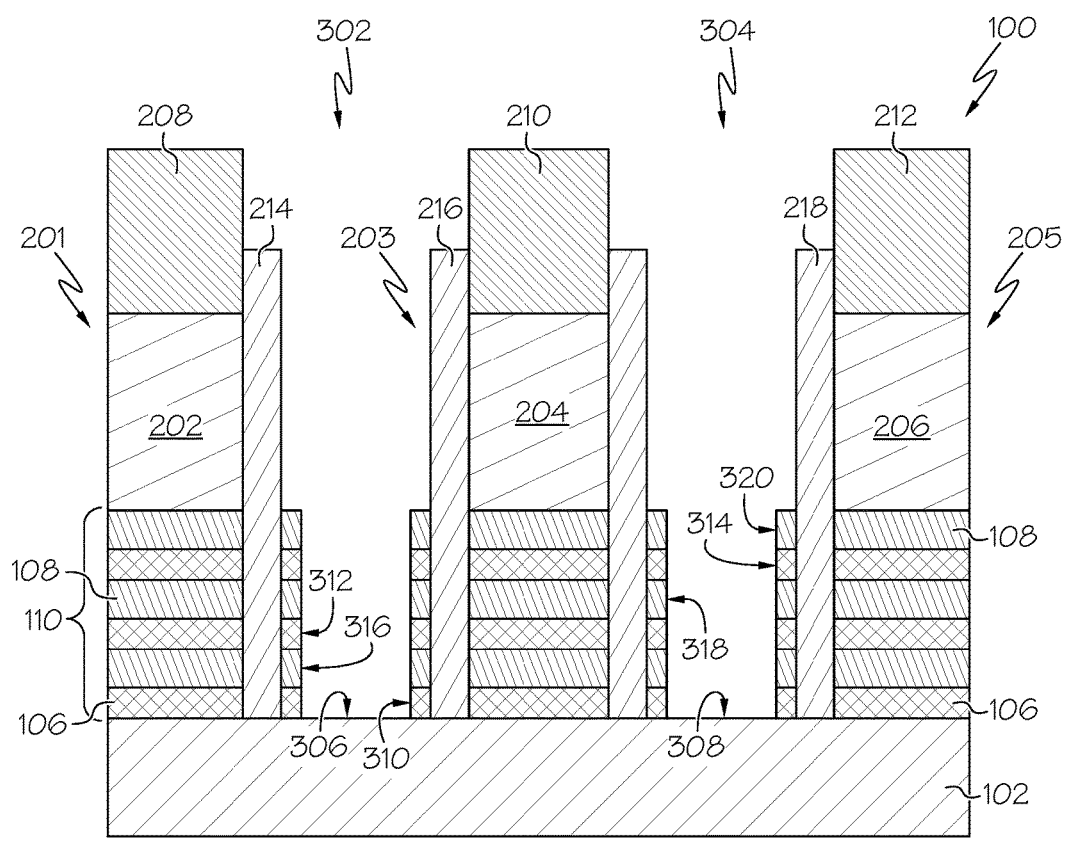
FIG. 3 is a cross-sectional view of the nano-sheet semiconductor structure after portions the nano-sheet have been removed according to one embodiment of the present invention.

FIG. 3 shows that exposed portions of the alternating stack 110, which do not underlie a disposable gate stack and spacer 214, 216, 218, are removed. For example, a directional etching process such as a reactive-ion-etching (RIE) process is utilized to remove the exposed portions of the alternating stack 110. This etching process results in a trench 302, 304 being formed between the spacers 214, 216, 218 of neighboring disposable gate stacks 202, 204, 206. Each of the trenches expose a portion of the substrates top surface 306, 308; ends 310, 312, 314 of the first semiconductor material portions 106; and ends 316, 318, 320 of the second semiconductor material portions 108. It should be noted that FIG. 3 shows the ends 310, 312, 314 of the first semiconductor material portions 106 and ends 316, 318, 320 of the second semiconductor material portions 108 extending past the spacers sidewalls for illustration purposes only.

Figure 4:
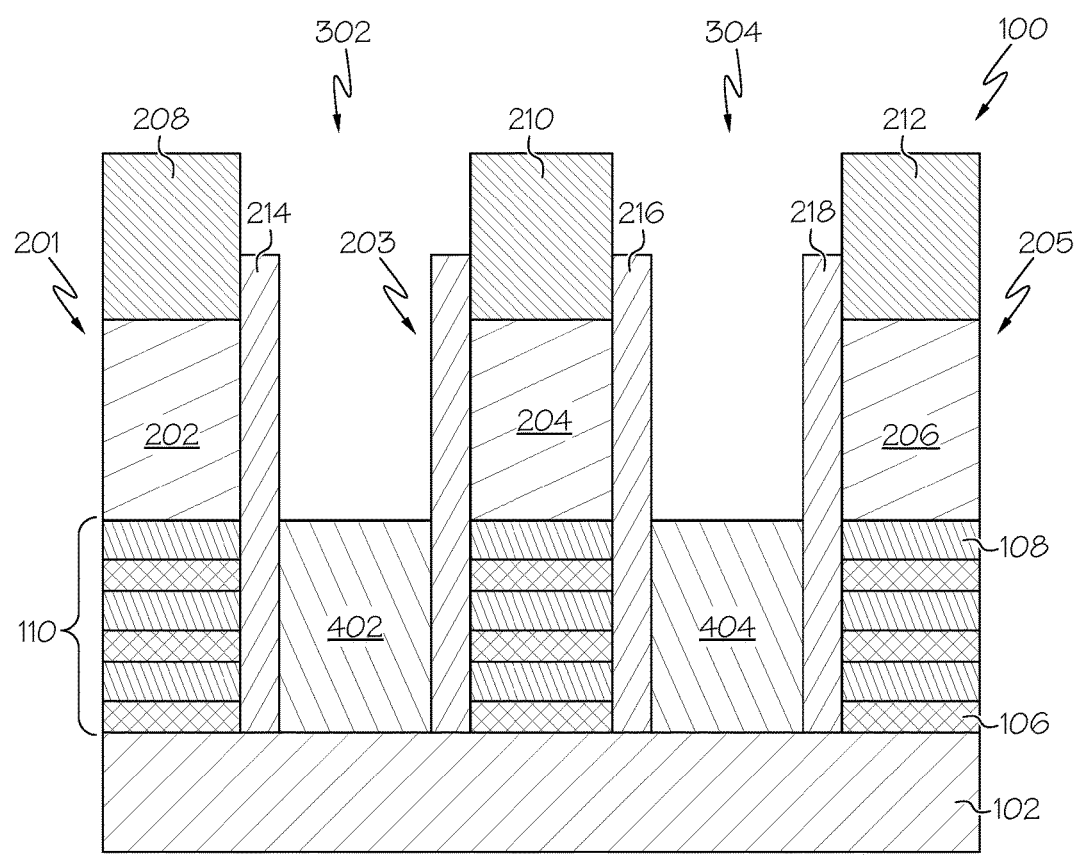
FIG. 4 is a cross-sectional view of the nano-sheet semiconductor structure after source and drain regions have been formed according to one embodiment of the present invention.

A selective epitaxy process is then performed to form source and drain regions 402, 404 as shown in FIG. 4. In one embodiment, the ends 310, 312, 314 of the first semiconductor material portions 106 and/or the ends 316, 318, 320 of the second semiconductor material portions 108 are used as seeds for the epitaxy process. During the selective epitaxy process, a semiconductor material is deposited only on semiconductor surfaces, and does not nucleate on dielectric surfaces. The source region 402 grows from surfaces of the first semiconductor material portions 106 and/or the second semiconductor material portions 108 located on one side of the disposable gate structures 201, 203, 205. The drain region 404 grows from surfaces of the first semiconductor material portions 106 and/or the second semiconductor material portions 108 located on the other side of the disposable gate structures 201, 203, 205. Each of the source and drain regions 402, 404, in one embodiment is single crystalline, and is epitaxially aligned to the single crystalline structure of the vertical stack of the first semiconductor material portions 106 and the second semiconductor material portions 108. The source and drain regions 402, 404, in one embodiment, is formed with in-situ doping of the electrical dopants, or by deposition of an intrinsic semiconductor material and subsequent introduction of electrical dopants by ion implantation, plasma doping, gas phase doping, or out-diffusion from a disposable doped silicate glass layer. In one embodiment, activation of the dopants forms a sharp junction.

Figure 5:
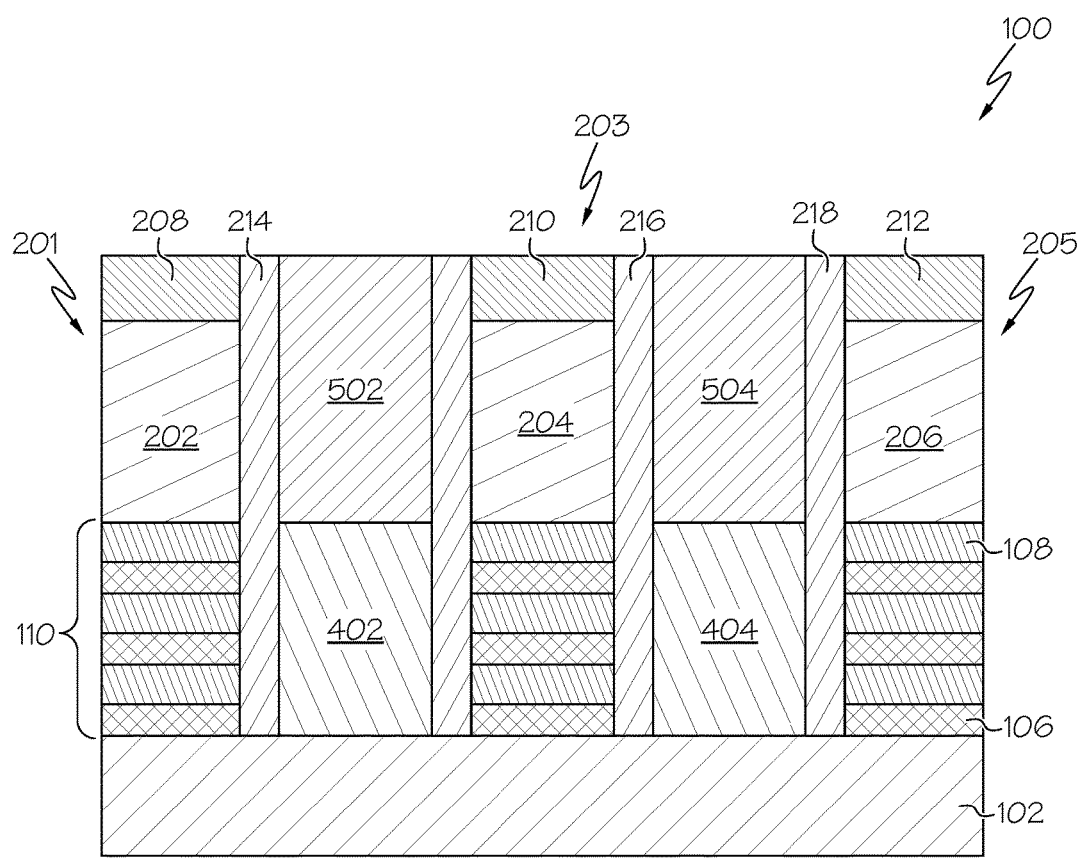
FIG. 5 is a cross-sectional view of the nano-sheet semiconductor structure after an inter-layer dielectric layer has been formed on the source and drain regions according to one embodiment of the present invention.

FIG. 5 shows that the trenches 302, 304 are filled with an inter-layer dielectric (ILD) 502, 504 after the source and drain regions 402, 404 have been formed. A chemical mechanical planarization (CMP) is then performed. The CMP process stops at a top surface of the spacers 214, 216, 218. The interlayer dielectric 502, 504, in one embodiment, comprises SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the interlayer dielectric 502, 504 include any of the aforementioned materials in porous form, or in a form that changes during processing to or from being porous and/or permeable to being non-porous and/or non-permeable.

Figure 6:
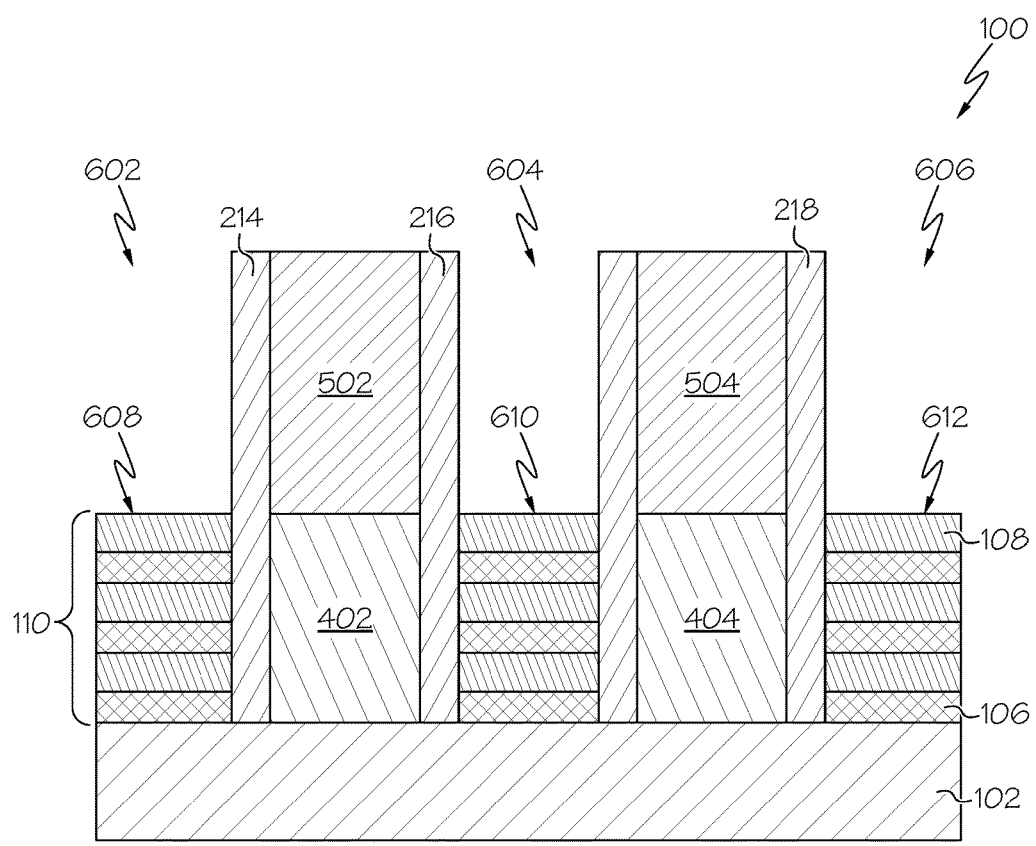
FIG. 6 is a cross-sectional view of the nano-sheet semiconductor structure after the disposable gates have been removed according to one embodiment of the present invention.

The disposable gate structures 201, 203, 205 are then removed, as shown in FIG. 6. At least one etch process, which can include an isotropic etch and/or an anisotropic etch, is utilized to remove the disposable gate structures 201, 203, 205. For example, the disposable gate structures 201, 203, 205 can be removed by wet etch processes. A gate cavity 602, 604, 606 is formed in the volume from which the disposable gate structures 201, 203, 205. A portion 608, 610, 612 of the top surface of the top/upper most second semiconductor portion 108 is exposed within each gate cavity 602, 604, 606. Sidewall surfaces of a portion of the spacers 214, 216, 218 are also exposed within each gate cavity 602, 604, 606.

Figure 7:
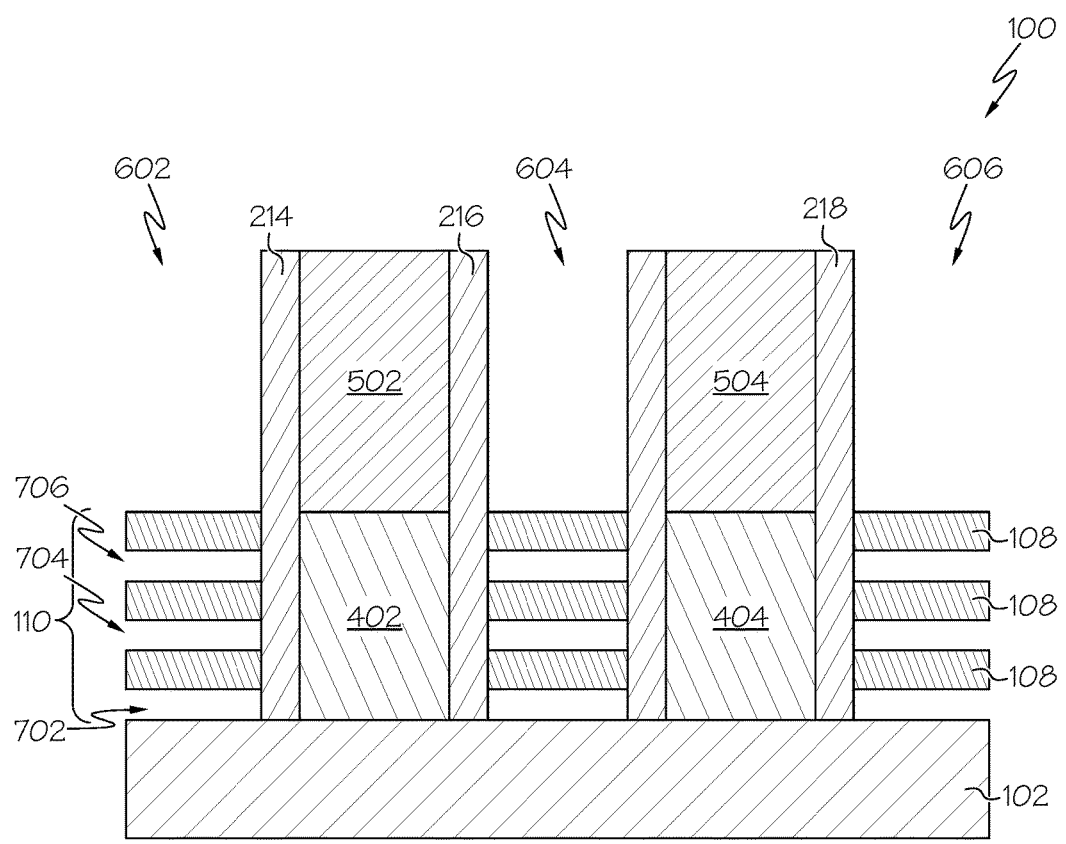
FIG. 7 is a cross-sectional view of the nano-sheet semiconductor structure after the first semiconductor layers have been removed according to one embodiment of the present invention.

FIG. 7 shows that a selective etching process is performed to remove the first semiconductor material portions 106 selective to the second semiconductor material portions 108 of the alternating stack 110. For example, a wet etch process or a reactive ion etch process can be utilized to selectively remove the first semiconductor material portions 106 of the alternating stack 110. This process forms cavities 702, 704, 706 between each of the second semiconductor material portions 108 of the alternating stack 110, which are anchored by the epitaxy material of the source/drain regions 402, 404.

Figure 8:
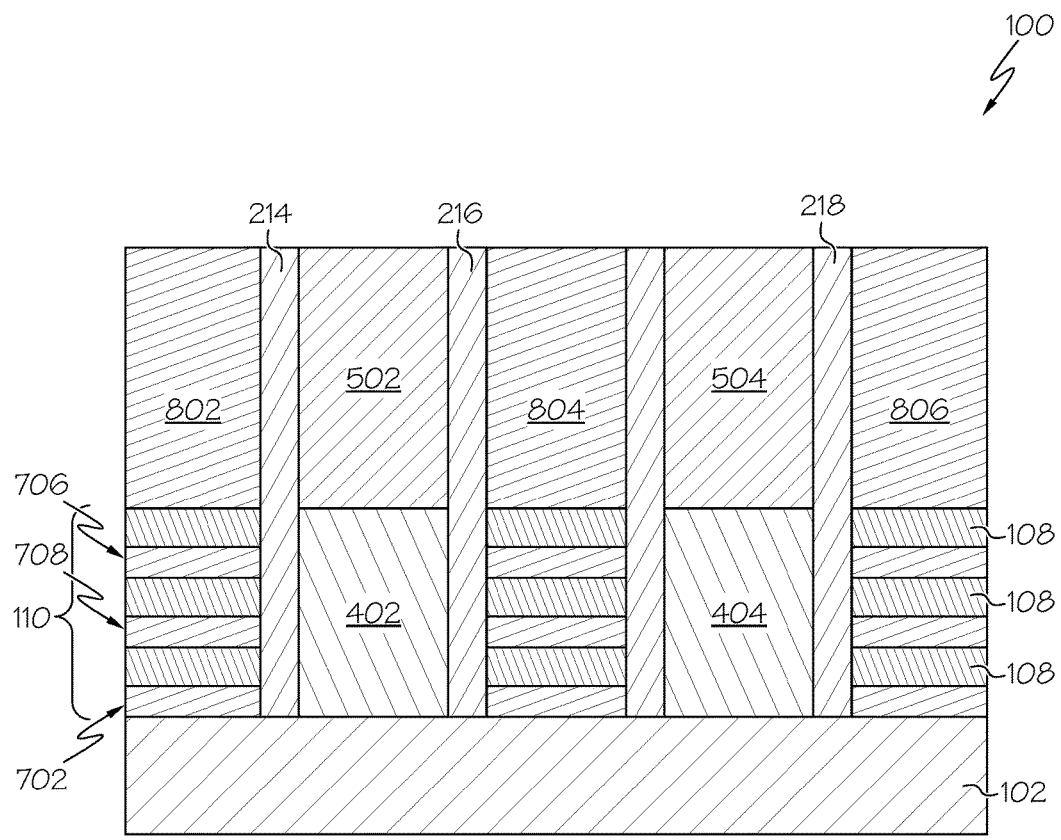
FIG. 8 is a cross-sectional view of the nano-sheet semiconductor structure after a metal gate material has been deposited to form a metal gate on a top-most layer of the second semiconductor layers, and to form metal gate material layers in the areas where the first semiconductor layers have been removed according to one embodiment of the present invention.

A replacement gate structure 802, 804, 806 is formed within each of the gate cavities 602, 604, 606, as shown in FIG. 8. For example, at least one conductive material is deposited to form at least one conductive material layer within the each of the gate cavities 602, 604, 606 and within each of the cavities 702, 704, 706 between each of the second semiconductor material portions 108 of the alternating stack 110. Then, any conductive material layer above the top surface of the spacers 214, 216, 218 and ILD 502, 504 is removed, for example, by chemical mechanical planarization (CMP). The remaining portion of the at least one conductive material layer constitutes the replacement gate structure 802, 804, 806 with replacement gate material disposed between each of the second semiconductor material portions. Therefore, the alternating stack 110 now comprises alternating layers of metal gate material layers 808, 810, 812 and second semiconductor material portions layers 108.

Figure 9:
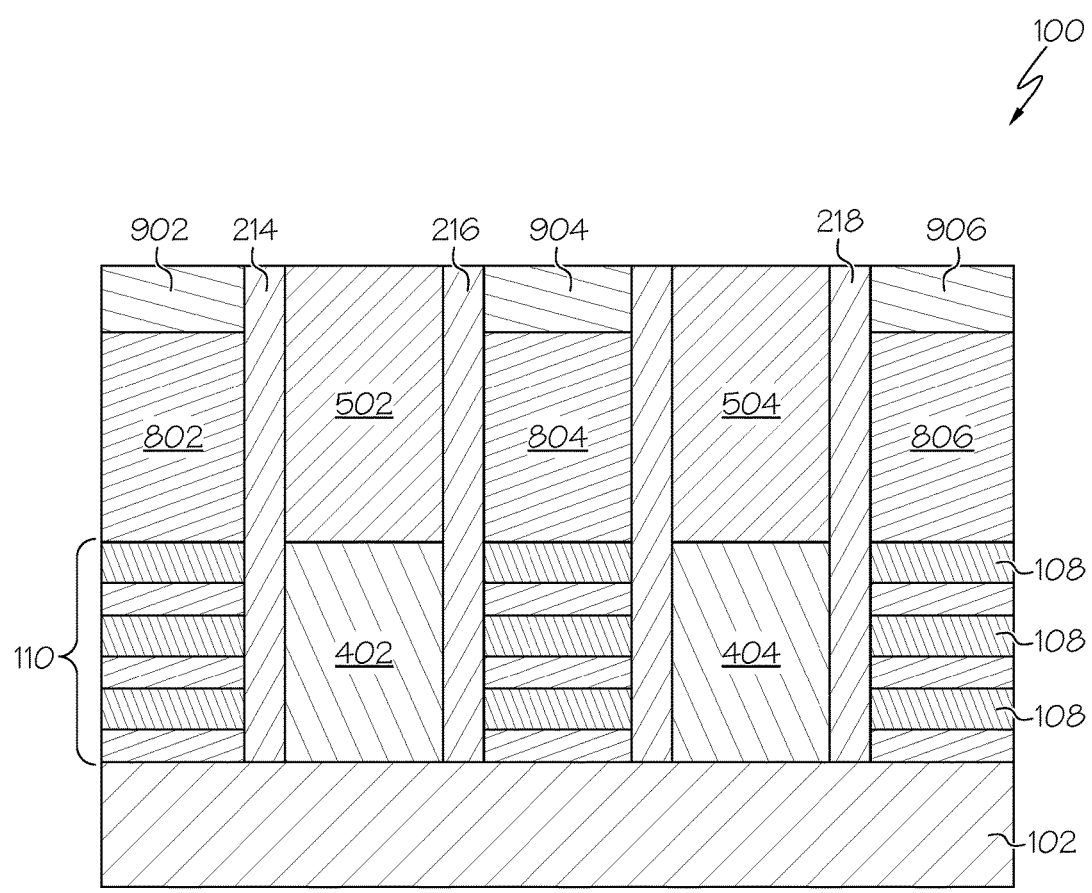
FIG. 9 is a cross-sectional view of the nano-sheet semiconductor structure after a cap layer has been formed on the metal gates according to one embodiment of the present invention.

The replacement gate structures 802, 804, 806 are then recessed to form a cap layer 902, 904, 906, as shown in FIG. 9. The cap layers 902, 904, 906, in one embodiment, comprise a dielectric material such as silicon nitride, silicon oxide, or a dielectric metal oxide formed by chemical vapor deposition (CVD) or any other suitable method. Any cap layer material above the top surface of the spacers 214, 216, 218 and the MD layers 502, 504 is removed.

Figure 10:
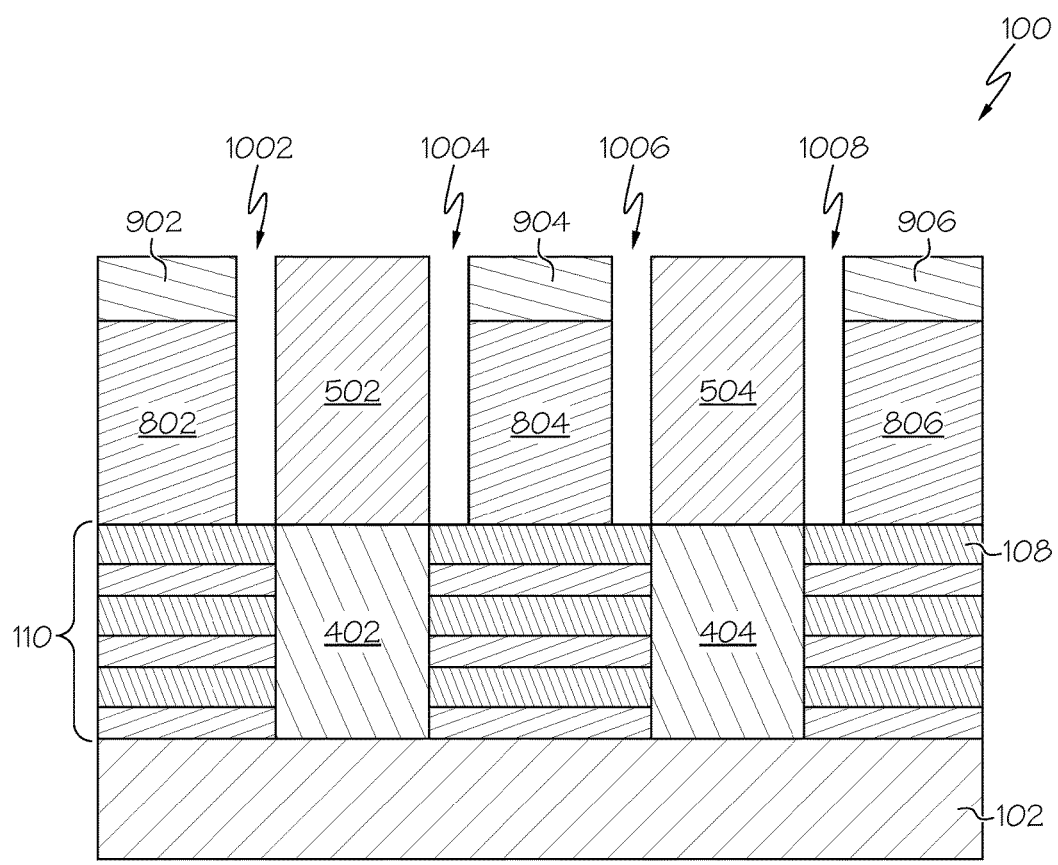
FIG. 10 is a cross-sectional view of the nano-sheet semiconductor structure after the spacers have been removed forming trenches adjacent to the inter-layer dielectric layers according to one embodiment of the present invention.

One issue with the structure shown in FIG. 9 is that the replacement gate structure 802, 804, 806 can short to the source/drain 402, 404 since the gate metal fills in spaces close to the material of the source/drain 402, 404. This can result in poor capacitance. Therefore, after the cap layers 902, 904, 906 are formed the spacers 214, 216, 218 are removed, as shown in FIG. 10. For example, an anisotropic etch with low selectivity to Si/SiGe is performed to remove both the spacer and nanowires simultaneously. This process forms a trench 1002, 1004, 1006, 1008 between the sidewalls of the gate structures 802, 804, 806 (including their cap layers 902, 904, 906) and the ILD layers 502, 504. The trenches 1002, 1004, 1006, 1008 expose a portion of the top surface of the top/upper most second semiconductor portion 108.

Figure 11:
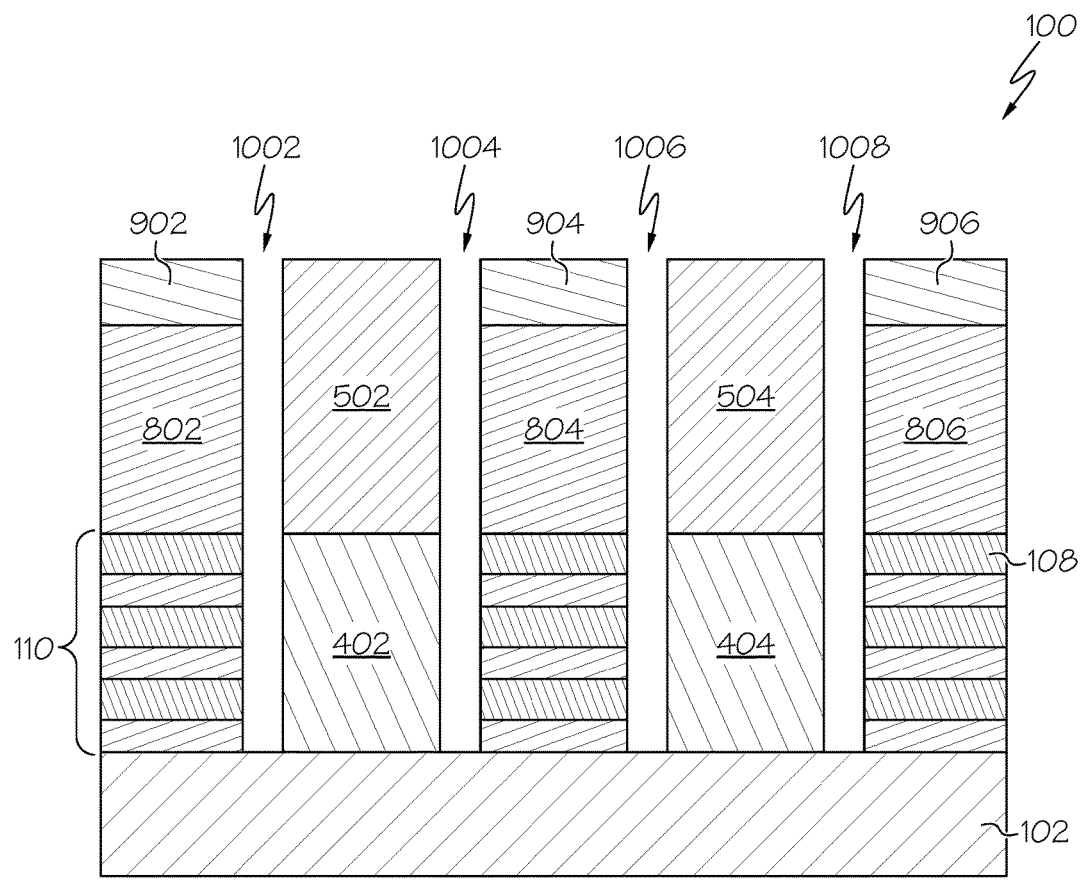
FIG. 11 is a cross-sectional view of the nano-sheet semiconductor structure after portions of the alternating second semiconductor layers and metal gate material layers underlying the trenches of FIG. 10 have been removed according to one embodiment of the present invention.

An isotropic RIE process is then performed to remove the material underlying the underlying the trenches 1002, 1004, 1006, 1008, as shown in FIG. 11. For example, the portions of the second semiconductor material 108 and the portions of the metal gate material 802 between each layer of the second semiconductor material 108 underlying the trenches 1002, 1004, 1006, 1008 is removed. This etching process extends the trenches 1002, 1004, 1006, 1008 down to (and exposing) the top surface of substrate 102.

Figure 12:
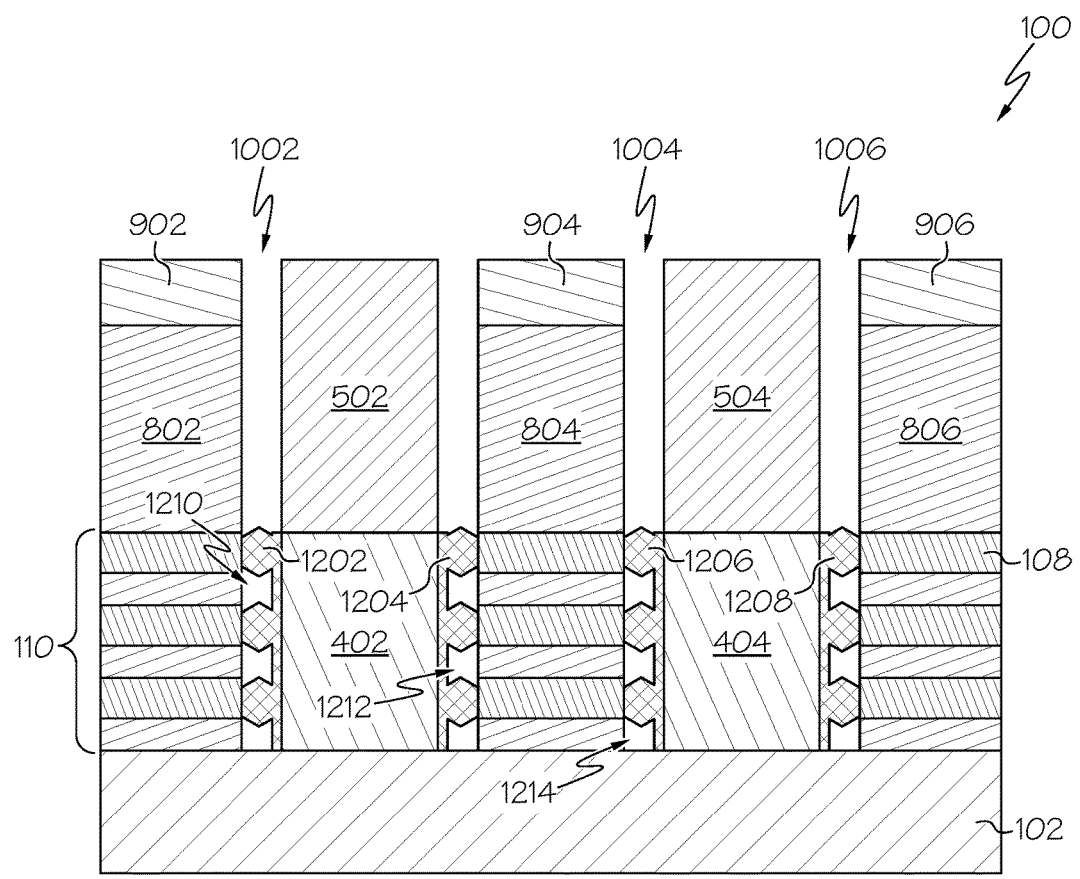
FIG. 12 is a cross-sectional view of the nano-sheet semiconductor structure after interconnects have been epitaxially grown between and in contact with the second semiconductor layers and the source/drain regions according to one embodiment of the present invention.

A material is then epitaxially grown between and contacting each exposed portion of the second semiconductor material 108 and the source/drains 402, 404 within the trenches 1002, 1004, 1006, 1008, as shown in FIG. 12. The epitaxially grown material, in on embodiment, is a semiconductor material such as (but not limited to) Si, SiGe, with various levels of Ge, and stress/strain as well as options for additional doping of B, P. The material, in one embodiment, is formed with in-situ doping of the electrical dopants. The grown material forms interconnects 1202, 1204, 1206, 1208 ends/sidewalls of the second semiconductor material 108 exposed within the trenches 1002, 1004, 1006, 1008 and sidewalls of the source/drain regions 402, 404.

Figure 13:
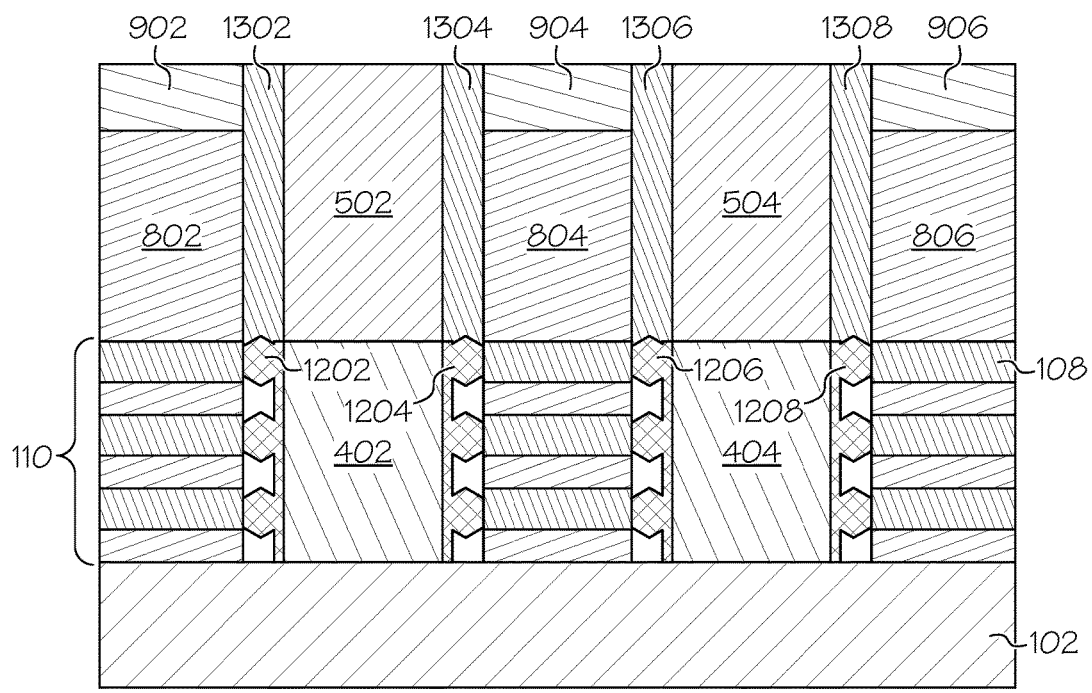
FIG. 13 is a cross-sectional view of the nano-sheet semiconductor structure after a spacer material has been deposited within the trenches in contact with the top-most interconnects, the inter-layer dielectric layers, and the metal gates according to one embodiment of the present invention.

The epitaxial growth process also forms air gaps (pockets/cavities) 1210, 1212, 1214 between vertical pairs of interconnects and between the top surface of the substrate 102 and the interconnect directly above the substrate 102. The air gaps (pockets/cavities) 1210, 1212, 1214 act as spacers between the interconnects 1202, 1204, 1206, 1208 and the gate metal material layers 808, 810, 812. FIG. 13 shows that portions of the trenches 1002, 1004, 1006, 1008 remaining above the uppermost interconnects 1202, 1204, 1206, 1208 are backfilled with a spacer material to form spacers 1302, 1304, 1306, 1308, therein. The spacer material, in one embodiment, comprises a dielectric material such as SiN, SiBCN, SiBCO or other low-k materials. The structure shown in FIG. 13 provides controllable low-level leakage from the gate to source drain regions. In addition, additional control over the interconnect material provides improved performance/speed of devices.

Figure 14:
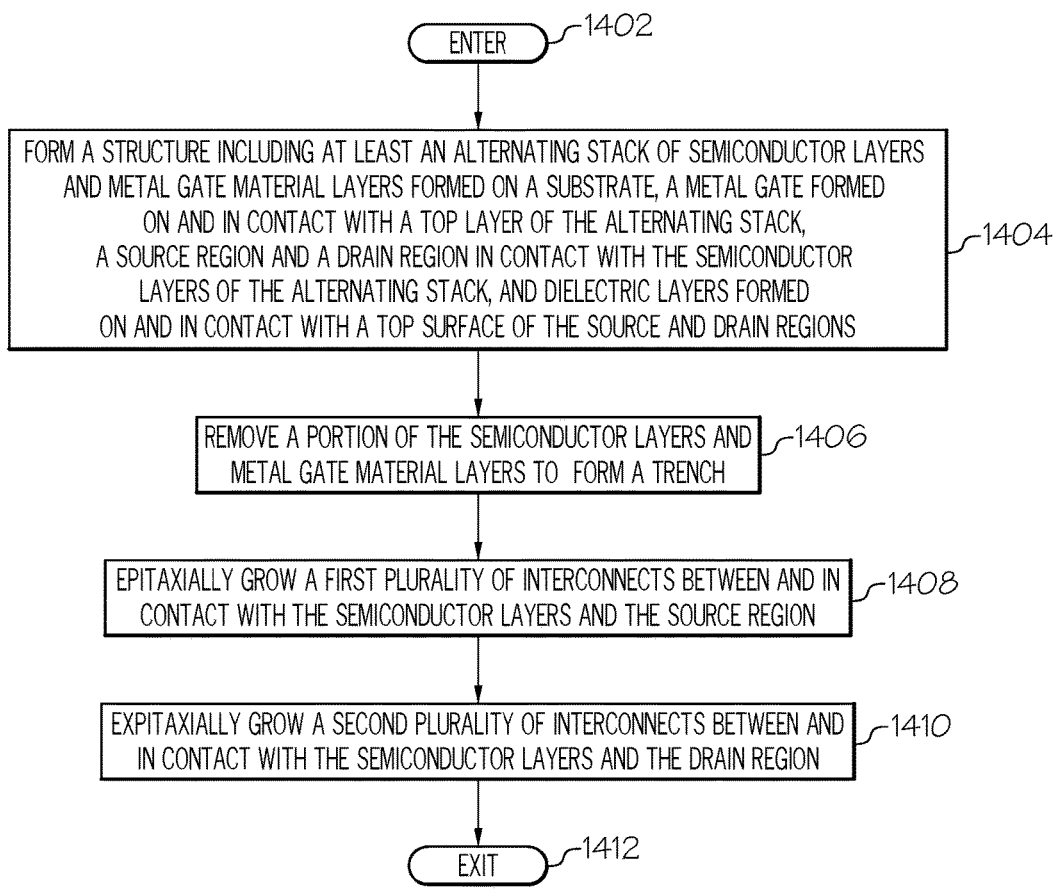
FIG. 14 is an operational flow diagram illustrating one process for fabricating nano-sheet semiconductor structures according to one embodiment of the present invention.

FIG. 14 is an operational flow diagram illustrating one process for fabricating a nano-sheet semiconductor structure. It should be noted that each of the steps shown in FIG. 14 has been discussed in greater detail above with respect to FIGS. 1-13. In FIG. 14, the operational flow diagram begins at step 1402 and flows directly to step 1404. A structure, at step 1404, is formed including at least an alternating stack of semiconductor layers and metal gate material layers formed on a substrate, a metal gate formed on and in contact with a top layer of the alternating stack, a source region and a drain region in contact with the semiconductor layers of the alternating stack, and dielectric layers formed on and in contact with a top surface of the source and drain regions, respectively.

A portion of the semiconductor layers and metal gate material layers, is removed, at step 1406. This removal process forms a trench exposing sidewalls of the metal gate and sidewalls of the source and drain regions. A first plurality of interconnects, at step 1408, is epitaxially grown between and in contact with the semiconductor layers and the source region. A second plurality of interconnects, at step 1410, is epitaxially grown between and in contact with the semiconductor layers and the drain region. The control flow exits at step 1412

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention can be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for forming a semiconductor structure, the method comprising:
   forming a structure comprising at least an alternating stack of semiconductor layers and metal gate material layers formed on a substrate, a metal gate formed on and in contact with a top layer of the alternating stack, a source region and a drain region in contact with the alternating stack, and dielectric layers formed on and in contact with a top surface of the source and drain regions, respectively;
   removing a portion of the semiconductor layers and metal gate material layers, wherein the removing forms trenches exposing at least sidewalls of the source and drain regions;
   forming a first plurality of interconnects between and in contact with the semiconductor layers and the source region; and
   forming a second plurality of interconnects between and in contact with the semiconductor layers and the drain region.

2. The method of claim 1, further comprising:
   prior to removing the portion of the semiconductor layers and metal gate material layers, etching spacers surrounding the source region, the drain region, and the dielectric layers, wherein the etching forms trenches between the metal gate and the dielectric layers and above the portion of the semiconductor layers and metal gate material layers.

3. The method of claim 2, further comprising:
   after the first and second plurality of interconnects have been formed, depositing a spacer material within the trenches.

4. The method of claim 1, wherein forming the first and second plurality of interconnects forms air pockets between the metal gate material layers and the source region, and between the metal gate material layers and the drain region.

5. The method of claim 1, wherein forming the structure comprises:
   forming an alternating vertical stack of the semiconductor layers and sacrificial semiconductor layers;
   forming at least one disposable gate on the alternating vertical stack; and
   forming a spacer around the disposable gate and a portion of the alternating vertical stack underlying the disposable gate.

6. The method of claim 5, further comprising:
   forming a cap layer on and in contact with a top portion of the alternating stack of semiconductor layers.

7. The method of claim 5, wherein forming the structure comprises:
   epitaxially growing each semiconductor layer and each sacrificial semiconductor layer in the alternating stack of semiconductor layers and sacrificial semiconductor layers.

8. The method of claim 7, wherein the forming further comprises:
   patterning the alternating stack of semiconductor layers and sacrificial semiconductor layers.

9. The method of claim 5, wherein forming the structure further comprises:
   removing the disposable gate, the removing forming a trench exposing the portion of the alternating vertical stack; and
   removing the sacrificial semiconductor layers.

10. The method of claim 9, wherein forming the structure further comprises
    depositing metal gate material within the trench, wherein the depositing forms the metal gate and the metal gate material layers.

11. The method of claim 5, wherein forming the structure further comprises:
    removing a first portion of the alternating vertical stack in a first area corresponding to the source region;
    removing a second portion of the alternating vertical stack in a second area corresponding to the drain region; and
    epitaxially growing the source region and the drain region within the first and second areas, respectively, wherein the source and drain regions are grown in contact with the portion of the alternating vertical stack underlying the disposable gate.

12. The method of claim 11, further comprising:
    depositing an inter-layer dielectric material on and in contact with the source region and the drain region.

13. The method of claim 1, further comprising:
    forming a cap layer on and in contact with the metal gate.

14. A method for forming a semiconductor structure, the method comprising:
    forming an alternating stack of semiconductor layers and metal gate material layers on a substrate;
    forming a metal gate on and in contact with a top layer of the alternating stack;
    removing a portion of the semiconductor layers and metal gate material layers, wherein the removing forms at least one trench; and
    forming a plurality of interconnects within the at least one trench, wherein each interconnect in plurality of interconnects contacts a semiconductor layer of the alternating stack, the formation of the plurality of interconnects forms air pockets between pairs of interconnects in the plurality of interconnects.

15. The method of claim 14, further comprising:
    after the plurality of interconnects have been formed, depositing a spacer material within the first and second trenches.

16. The method of claim 14, wherein forming alternating stack of semiconductor layers and metal gate material layers comprises:
    forming an alternating vertical stack of the semiconductor layers and sacrificial semiconductor layers.

17. The method of claim 16, further comprising:
    patterning the alternating vertical stack of semiconductor layers and sacrificial semiconductor layers.

18. The method of claim 16, further comprising:
    removing the sacrificial semiconductor layers, the removing forming voids between the semiconductor layers; and
    depositing metal gate material within the voids, wherein the depositing forms the metal gate material layers.

19. The method of claim 14, wherein forming the metal gate comprises:
    forming an alternating vertical stack of the semiconductor layers and sacrificial semiconductor layers;
    forming at least one disposable gate on the alternating vertical stack;
    forming a spacer around the disposable gate and a portion of the alternating vertical stack underlying the disposable gate;
    after forming the spacer, removing the disposable gate, the removing forming a trench exposing the portion of the alternating vertical stack;

removing the sacrificial semiconductor layers; and depositing metal gate material within the trench, wherein the depositing forms the metal gate and the metal gate material layers.

20. A method for forming a semiconductor structure, the method comprising:

forming a structure comprising at least
- a plurality of alternating stacks each comprising semiconductor layers and metal gate material layers formed on a substrate, and a plurality of doped regions each in contact with at least one alternating stack of the plurality of stacks;

removing a portion of each alternating stack of the plurality of stacks in contact with at least one doped region of the plurality of doped regions, the removing forming a plurality of trenches exposing a sidewall of the at least one doped region; and epitaxially growing a plurality of interconnects within the trenches, wherein each interconnect of the plurality of interconnects is between and in contact with one of the semiconductor layers and one doped region of the plurality of doped regions.

\* \* \* \* \*